US006755946B1

(12) United States Patent
Patton et al.

(10) Patent No.: US 6,755,946 B1
(45) Date of Patent: Jun. 29, 2004

(54) CLAMSHELL APPARATUS WITH DYNAMIC UNIFORMITY CONTROL

(75) Inventors: Evan E. Patton, Portland, OR (US); Jonathan D. Reid, Sherwood, OR (US); Jeffrey A. Hawkins, Portland, OR (US); Dinesh S. Kalakkad, Portland, OR (US); Steven T. Mayer, Lake Oswego, OR (US)

(73) Assignee: Novellus Systems, Inc., San Jose, CA (US)

( * ) Notice: Subject to any disclaimer, the term of this patent is extended or adjusted under 35 U.S.C. 154(b) by 246 days.

(21) Appl. No.: 10/010,954

(22) Filed: Nov. 30, 2001

(51) Int. Cl.[7] ............................ C25D 17/06; C25D 21/12
(52) U.S. Cl. ............................. 204/224 R; 204/228.7; 204/229.8; 204/297.01; 204/297.14
(58) Field of Search .................... 204/224 R, 228.1, 204/228.7, 229.8, 297.01, 297.14; 205/81, 123, 157

(56) References Cited

U.S. PATENT DOCUMENTS

| 5,221,449 A | 6/1993 | Colgan et al. |
| 5,281,485 A | 1/1994 | Colgan et al. |
| 5,482,611 A | 1/1996 | Helmer et al. |
| 5,853,559 A | * 12/1998 | Tamaki et al. ............... 205/157 |
| 5,985,762 A | 11/1999 | Geffken et al. |
| 6,074,544 A | 6/2000 | Reid et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,176,985 B1 | 1/2001 | Downes, Jr. et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,217,716 B1 | 4/2001 | Fai Lai |
| 6,221,757 B1 | 4/2001 | Schmidbauer et al. |
| 6,251,238 B1 | 6/2001 | Kaufman et al. |
| 6,251,242 B1 | 6/2001 | Fu et al. |
| 6,261,433 B1 | 7/2001 | Landau |
| 6,267,860 B1 | * 7/2001 | Brodsky ....................... 205/96 |
| 6,270,646 B1 | 8/2001 | Walton et al. |
| 6,274,008 B1 | 8/2001 | Gopalraja et al. |
| 6,277,249 B1 | 8/2001 | Gopalraja et al. |
| 6,517,689 B1 | * 2/2003 | Hongo et al. ............ 204/228.7 |
| 6,627,052 B2 | * 9/2003 | Fluegel et al. ........... 204/224 R |

FOREIGN PATENT DOCUMENTS

WO  WO 99/41434  8/1999

* cited by examiner

Primary Examiner—Roy King
Assistant Examiner—William T. Leader
(74) Attorney, Agent, or Firm—Beyer, Weaver & Thomas, LLP.

(57) ABSTRACT

The present invention includes apparatus and methods for measuring impedance of a layer of deposited metal on a substrate and controlling deposition uniformity during electroplating. A first circuit delivers plating current to a metal layer on the substrate, and a second circuit, electrically isolated from the first, measures the impedance. Methods of the invention provide multi-point sheet resistance measurements before and during an electroplating process on a substrate. In a specific example, resistance is measured via a copper seed layer during electroplating.

29 Claims, 10 Drawing Sheets

CLAMSHELL APPARATUS WITH DYNAMIC UNIFORMITY CONTROL

FIELD OF THE INVENTION

The present invention pertains to apparatus and methods for measuring electrical resistance of a thin layer of deposited metal on a substrate and controlling the uniformity of deposited metal during electroplating, electropolishing, or other electrolytic processes that may alter the uniformity and profile of the metal layer. Particular apparatus and methods apply to continuity checking of seed layers and uniformity control of deposited metal layers on partially fabricated integrated circuits during an electrolytic processing.

BACKGROUND OF THE INVENTION

In order to electroplate metal onto a work piece (or electropolish metal from a work piece), particularly non-conducting or semi-conducting work pieces, a seed layer of metal is typically used to provide a conductive surface through which electrical current can be passed in order to initiate plating. During electrolytic processes, electrical contact to the seed layer on the work piece is made through various mechanisms depending upon the size of the work piece and the criticality of the contact area For integrated circuit fabrication, the usable plated surface area of a silicon wafer must be maximized so that the highest possible yield of circuit dies can be achieved. In order to increase the usable area, electrical contact to wafers is commonly made by using pins which each make a small surface area (point) contact to the seed layer on the plating surface of the wafer. Preferably, these pins are positioned as far out on the wafer's edge as possible.

One problem associated with electrical contacts used to supply plating current is that the contacts are exposed to the corrosive effects of plating solutions. In high throughput scenarios such as integrated circuit fabrication, this is particularly problematic. One way to overcome this problem (and to protect the backside of the wafer) is to use an apparatus that has a sealing element between the pins and the plating solution, so that the pins are protected from the plating solution during plating. Although the pins are protected behind the seal, the sealing element itself covers valuable wafer surface area that otherwise would provide usable plating surface.

A problem associated with electrical contacts used to supply plating current to a work piece (e.g a wafer) is variations in resistance among the contacts. Small variations in the resistance of each contact can have a large effect on the thickness distribution of the plated metal on the wafer surface, particularly near the edge of the wafer. Variations in resistance can be caused by poor correction to electrical contacts, build up of plated metal on the contacts, corrosion of the contacts, and the like.

Increasing the usable plated surface area depends not only on the total plated surface area as described above, but also on the quality of the plated surface area, in particular the uniformity of the deposited metal. The uniformity of the plated metal can be directly correlated not only to the uniformity of the plating process, but also to the continuity of the seed layer used to initiate the plating process. Thus, it is important to initiate an electroplating process with a seed layer that has very little if any discontinuous portions.

One way to effectively assess the continuity of the seed layer is by measuring its resistance across the wafer. Currently there are no plating apparatus that allow high-precision (multi-point) resistance measurements of seed layers. Also, with the growing sophistication and miniaturization of integrated circuits, there is a continuing need for highly uniform metal layers on wafers.

What is therefore needed are improved apparatus and methods for continuity checking of a thin layer of deposited metal on a substrate and controlling the uniformity of deposited metal during electroplating, electropolishing, or other electrolytic process that impacts the uniformity of the metal layer. Preferably, such apparatus and methods achieve this goal while increasing the usable surface area of the plated substrate.

SUMMARY OF THE INVENTION

The present invention pertains to apparatus and methods for measuring impedance of a thin layer of metal on a substrate and controlling the uniformity of the metal layer during electroplating, electropolishing, or other electrolytic process that impacts the uniformity of the metal layer.

Thus, one aspect of the invention is an apparatus for engaging a work piece during an electrolytic process. Such apparatus can be characterized by the following elements: a cup having an interior region and a lip within the interior region arranged such that lip can support the work piece while the work piece remains within the interior region; a first plurality of electrical contacts arranged about the lip for providing electrical current to the work piece via a metal layer thereon; a second plurality of electrical contacts arranged about the lip for measuring electrical resistance through the metal layer on the work piece; and a cone having a work piece contact surface that fits within the cup's interior and can contact the work piece in a manner that holds the work piece in a fixed position between the work piece contact surface and the lip. Preferably, a first circuit contains the first plurality of electrical contacts and a second circuit, isolated from the first circuit, contains the second plurality of electrical contacts. Also preferably the metal layer is a seed layer. In a further preferred embodiment, the first and second circuits are at least in part contained within the cup and the cone (wafer holding assembly). In a particularly preferred apparatus, each contact of the first plurality of electrical contacts has its own individually regulated current source.

Particular apparatus and methods apply to deposited metal layers on partially fabricated integrated circuits. In this context, preferably the cup's lip is sized and shaped to support a semiconductor wafer work piece. Preferably the seed layer and the deposited metal layer are copper; however, other preferred metal layers include cobalt, gold, rhodium, palladium, platinum, tin, chromium, and alloys or mixtures thereof. Also preferably, the cup's lip comprises a lip seal made from a material that provides a fluid tight seal with the semiconductor wafer when the wafer is held in place by the cone. The lip seal is preferably made of an elastomer, such as a silicone rubber, a fluoropolymer, a butyl rubber, and copolymers or other combinations of these. Specific examples include Chemraz (Green, Tweed, and Co.), Tefzel (Dupont), Sifel (Shin-Etsu), Viton (Dupont), and Kalrez (Dupont). Even more preferably, the first and second plurality of electrical contacts each have electrical contacts that are embedded in the elastomer. In this case, the lip seal includes a material that forms an electrically conductive path from the current supply to the wafer. In a preferred embodiment, the lipseal contains an embedded contact made of a material including at least one of Isocon (Circuit Components, Inc.), conductive polymers (for example metal or carbon impregnated polymers), wires, flat metal springs, and z-conductive polymers. Preferably the electrical contacts are made of metals or alloys that have superior conductive and anticorrosion properties. Alloys of noble metals can be created to maintain conductive and anticorrosion properties while improving mechanical properties (for example strength and fatigue life). Such materials include at least one of berylium-copper, gold-palladium, berylium-copper plated with gold-palladium, Paliney-7 (manufacturer J. M Ney), platinum plated on stainless steel, rhodium plated on stainless steel, and rhodium.

Preferably at least a portion of the cup is made from one or more of the following materials: a plastic, a ceramic, a plastic-coated ceramic, a plastic-coated metal, a glass, a glass-coated metal, a glass-coated ceramic, silicon-oxide coated ceramic, and a composite. Preferably a fluoropolymer is used for the coating of a plastic-coated ceramic or a plastic-coated metal. Preferred ceramics or a plastic-coated ceramics include alumina or zirconia.

Preferably each contact of the first plurality of electrical contacts comprises a resistor. Such a resistor will have a resistance that is large compared to all sources of resistance variation in the electrical current (e.g. plating current). In a particularly preferred embodiment, the resistor is a thick-film resistor made of a material including at least one of ruthenium oxide, platinum-silver, and palladium-silver. Preferably resistors of the first plurality of electrical contacts have an electrical resistance of between about 1 and 20 ohms, and more preferably about 6 ohms. Thick-film resistors are deposited by screen printing methods. They are trimmed to size by laser trimming after deposition, curing, and sealing (for example with glass or silicon oxide). Laser trimming provides accurate matching of conductive paths. Preferably the resistor is positioned at a location between about 2 and 50 mm from the point where its associated contact meets the seed layer, more preferably about 5 mm. Thus, it is desirable to have a large resistance close to the contact to minimize the effect of contact resistance variation.

Methods of the invention allow determination of continuity and resistance of a seed layer on a work piece and electroplating a metal thereon. Therefore another aspect of the invention is a method of electroplating a work piece having a seed layer on its plating surface. Such methods can be characterized by the following sequence: (a) checking the continuity of the seed layer by a resistance measurement using at least a four-point measurement; (b) immersing the work piece into a plating solution; and (c) electroplating a metal onto the work piece's plating surface. Preferably a first circuit is configured to deliver a plating current to the work piece, and the second circuit is configured to check the continuity of the seed layer, and both the first and the second circuits are are contained, at least in part, in a wafer holder of an electroplating apparatus. Preferably the work piece is a semiconductor wafer.

In one preferred method, during the plating process, the resistance of the deposited metal layer is measured and these measurements are used as a feedback control mechanism to tune the plating current. In a particularly preferred method, plating current is supplied via a plurality of electrical contacts, which are part of the first circuit, each contact having its own individually regulated current source. In this case, the described feedback is used to tune the plating current distribution across the plating surface of the work piece by varying the current supplied to individual electrical contacts. In this way, the uniformity of the plated metal is more precisely controlled.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described in terms of a "clamshell" electroplating apparatus; other apparatus can embody the invention as well. Also the aspects of the invention are described in terms of measuring the resistance of a seed layer on a wafer substrate; the invention can also used for measuring the resistance of any metal layer on a substrate, such as a barrier layer, or other conductive layer. In some descriptions herein, well-known processes, procedures, and components have not been described in detail so as not to unnecessarily obscure aspects of the present invention.

The following description assumes that the work piece to be electrolytically treated is a wafer, more particularly a semiconductor wafer. The invention is not so limited. The work piece may be of various shapes, sizes, and materials. In addition to semiconductor wafers, other work pieces that may take advantage of this invention include various conductive articles such as machine tools, weaponry, recording heads, recording media, and the like.

In this application, the term "electrical contact" is used to describe a device which makes an electrical connection (i.e.

an electrically conductive route) between a power source or a device for measuring resistance, and a metal or other electrically conductive layer on a work piece (e.g. a metal seed layer on a wafer). It is understood by one skilled in the art that when such an electrical connection is established, that some component or part of the described electrical contact will physically touch, for example, the metal layer. That is, each electrical contact has at least one joint or junction between itself and the conductive layer. In this application, the component or part of an "electrical contact" that actually touches the metal or other conductive layer is referred to as a "contact."

Generally, the invention is described below in terms of an electroplating apparatus and methods. The invention is not limited in this way. Apparatus of the invention can be used for electroplating, electropolishing, or other electrolytic process that can effect the uniformity and thickness of a metal layer on a work piece. Thus circuits described as configured to deliver plating current can also be used to electropolish, essentially reversing their role.

Figure 1A:
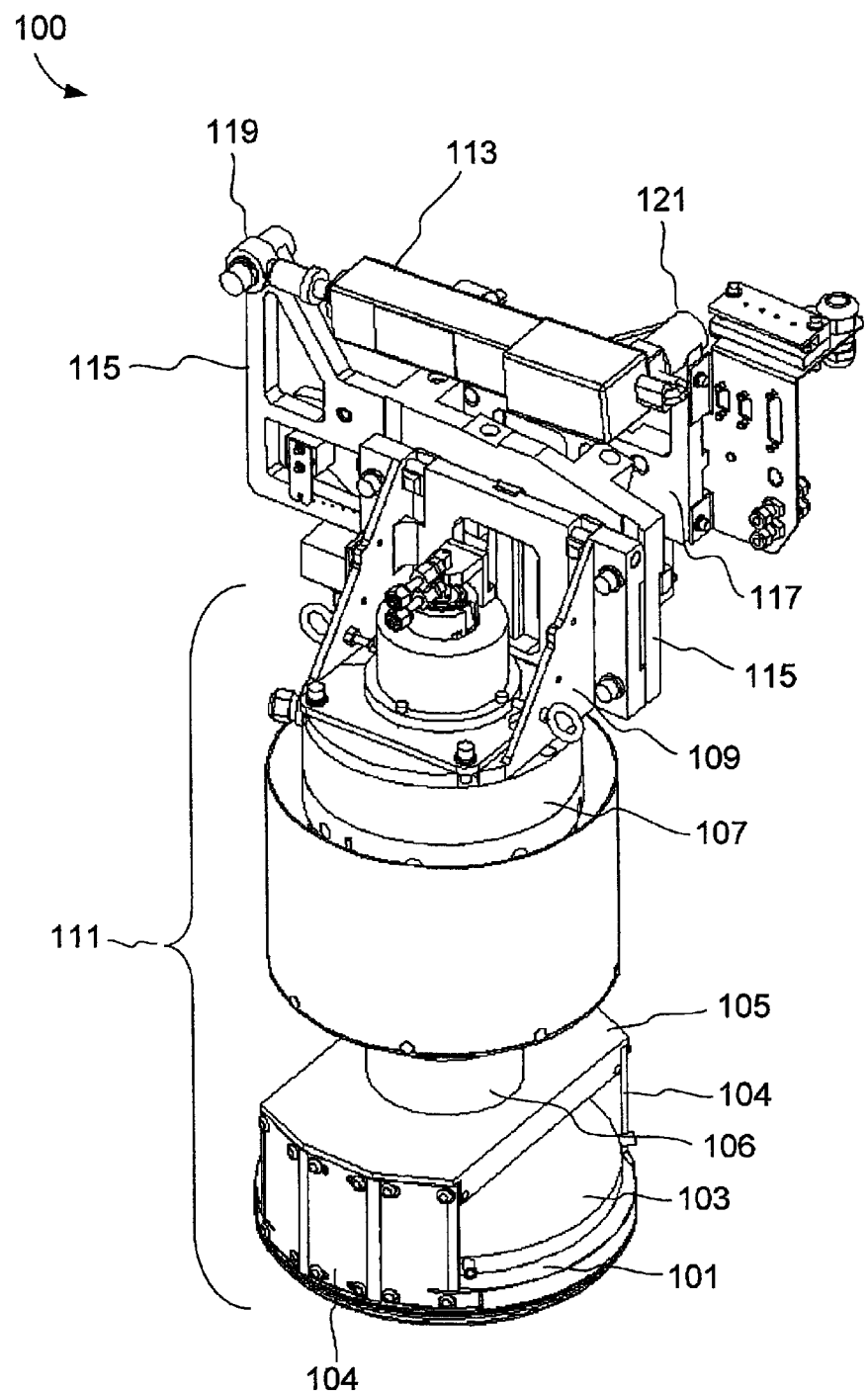
FIG. 1A depicts a wafer holder assembly for electrochemically treating semiconductor wafers used in accordance with the invention.

FIG. 1A provides a perspective view of a wafer holding and positioning apparatus 100 for electrochemically treating semiconductor wafers. It includes wafer engaging components (sometimes referred to herein as "clamshell" components) that are pertinent to embodiments of the invention. The actual clamshell assembly comprises a cup 101 and a cone 103. As will be shown in subsequent figures, cup 101 holds a wafer and cone 103 clamps the wafer securely in the cup. Various cup and cone designs beyond those specifically depicted here can function in accordance with this invention. Importantly, the cup has an interior region in which the workpiece sits and the cone presses the workpiece against a region of the cup to hold it in place.

In the depicted embodiment, the clamshell assembly (cup 101 and cone 103) is supported by struts 104, which are connected to a top plate 105. This assembly (101–105) is driven by a motor 107, via a spindle 106. Motor 107 is attached to a mounting bracket 109. Spindle 106 transmits torque (via motor 107) to the clamshell assembly to create rotation of a wafer (not shown in this figure) held therein during plating. An air cylinder (not shown) within spindle 106 also provides vertical force for engaging cup 101 with cone 103. When disengaged, an end effector can insert a wafer in between the cup and cone. After a wafer is inserted, the cone is engaged with the cup which immobilizes the wafer within apparatus 100. Once immobilized in apparatus 100, only the wafer front side (work surface) is exposed.

For the purposes of this discussion, the assembly including components 101–109 is collectively referred to as a wafer holder, 111. Note however, that the concept of a "wafer holder" extends generally to various combinations and subcombinations of components that engage a wafer and allow its movement and positioning.

A tilting assembly including a first plate 115 that is slidably connected to a second plate 117, is connected to mounting bracket 109. A drive cylinder 113 is connected both to plate 115 and plate 117 at pivot joints 119 and 121, respectively. Thus, drive cylinder 113 provides force for sliding plate 115 (and thus wafer holder 111) across plate 117. The distal end of wafer holder 111 (i.e. mounting bracket 109) is moved along an arced path (not shown) which defines the contact region between plates 115 and 117, and thus the proximal end of wafer holder 111 (i.e. cup and cone assembly) is tilted upon a virtual pivot.

The entire apparatus 100 is lifted vertically either up or down to immerse the proximal end of wafer holder 111 into a plating solution via another actuator (not shown). Thus, a two-component positioning mechanism provides both vertical movement along a trajectory perpendicular to an electrolyte and a tilting movement allowing deviation from a horizontal orientation (parallel to electrolyte surface) for the wafer (angled-wafer immersion capability). A more detailed description of the movement capabilities and associated hardware of apparatus 100 is described in U.S. patent application No. 09/872,341 incorporated by reference herein for all purposes.

Note that the apparatus 100 is typically used with a particular plating cell having a plating chamber which houses an anode (e.g., a copper anode) and electrolyte. The plating cell may also include plumbing or plumbing contacts for circulating electrolyte through the plating cell—and against the work piece being plated. It may also include membranes or other separators designed to maintain different electrolyte chemistries in an anode compartment and a cathode compartment. In one embodiment, one membrane is employed to define an anode chamber, which contains electrolyte that is substantially free of suppressors, accelerators, or other organic plating additives. This embodiment is described in more detail in U.S. patent application No. 09/706,272, filed Nov. 3, 2000, naming S. Mayer et al. as inventors, and incorporated herein by reference for all purposes. The plating cell may also include a separate membrane for controlling electrolyte flow patterns. In another embodiment, a diffuser membrane is employed for directing electrolyte upward the rotating wafer in a uniform front. This embodiment is described in U.S. Provisional Patent Application No. 60/295,116, which is incorporated herein by reference for all purposes.

The following description presents preferred embodiments of cup 101 and cone 103 of clamshell assemblies of the invention. For consistency, reference numbers from FIG. 1A will be used in subsequent figures, where appropriate.

Figure 1B:
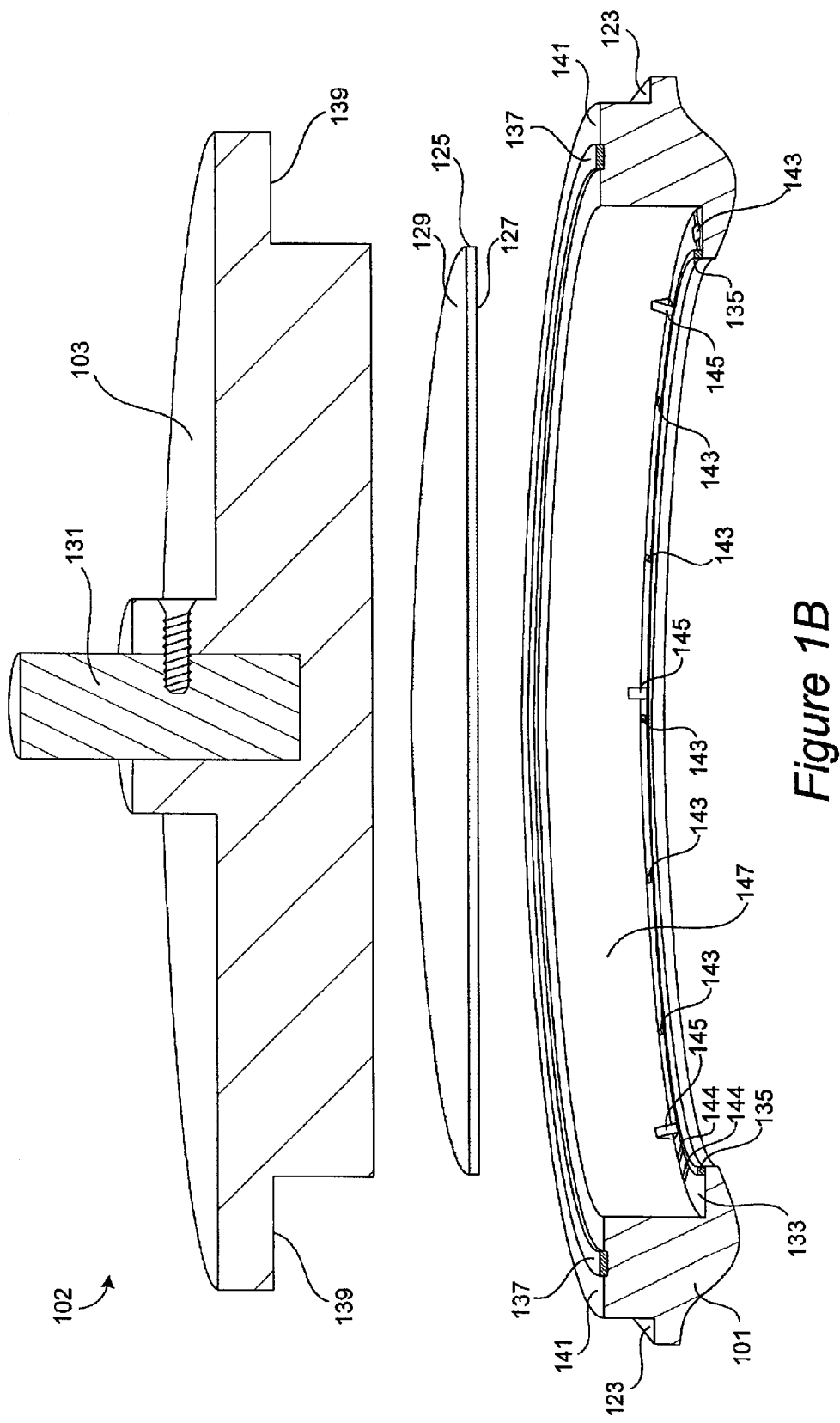
FIG. 1B is a cross sectional diagram depicting aspects of a cup and cone assembly of an electroplating apparatus in accordance with the invention.

FIG. 1B is a cross sectional depiction of a portion, 102, of assembly 100, including cup 101 and cone 103. Note that this figure is not meant to be an absolutely accurate depiction of the cup and cone assembly, but rather a simplified depiction for discussion purposes. Cup 101 is supported by top plate 105 via struts 104 (refer to FIG. 1A, struts 104 are secured to cup 101 in the area of outer edge 123 (depicted in FIG. 1B)). Cone 103 moves vertically within the assembly including the cup, struts, and top plate via air cylinder 131. Generally, cup 101 provides a support upon which wafer 125 rests. It includes an opening through which electrolyte from a plating cell can contact the wafer. Note that wafer 125 has a front side 127, which is where plating occurs. Only the periphery of wafer 125 rests on the cup. When engaged with cup 101, cone 103 presses down on the back side of the wafer, 129, to hold it in place during plating.

To load a wafer into assembly 102, cone 103 is held in a raised position, as depicted, via air cylinder 131 (until cone 103 touches top plate 105). From this position, a gap is created between the cup and the cone into which wafer 125 can be inserted, and thus loaded into the cup. Note in FIG. 1A that struts 104 are positioned on opposing sides of cup 101, covering only part of its circumference, thus the wafer is inserted between the opposing struts. Once the wafer is resting on cup 101, cone 103 is lowered to engage the wafer against the periphery of cup 101. Note also that wafer plating typically occurs while the wafer is rotating. As electrolyte flows upward towards the wafer, the rotation provides nearly uniform mass transfer to the wafer over the entire radial extent of the wafer.

Cup 101 supports wafer 125 via a lip 133. More specifically, the lip has a compressible lip seal 135, which forms a fluid-tight seal when cone 103 engages wafer 125 against lip seal 135. The lip seal prevents electrolyte from contacting the backside of wafer 125 (where it could introduce contaminating atoms such copper directly into silicon) and from contacting sensitive components of apparatus 101. Also shown is seal 137, which is also compressed (between ledge 139 of the cone and surface 141 of the cup) to form a fluid tight seal when cone 103 engages wafer 125. Thus, once the cup and cone are engaged, the wafer backside is protected from electrolyte exposure. Again, this figure is a simplified depiction.

As mentioned, before initiation of plating, wafer 125 is introduced to assembly 102 when cone 103 is raised above cup 101. When the wafer is initially introduced—typically by a robot end effector—its outermost edge rests lightly on lip seal 135. Wafer 125 must electrically communicate with a current source to maintain a potential difference between the anode and cathode (the wafer itself). In this invention, lip seal 135 has embedded contacts (not depicted in FIG. 1B) that are connected to a plurality of electrical contacts, which are divided into two groups. One group of electrical contacts, 143, is part of a first circuit for providing plating current to the work piece, and the other group of electrical contacts, 144, is part of a second circuit for measuring resistance of a metal layer deposited on the wafer. Preferably (but not necessarily) the second circuit is used to measure the resistance of a seed layer before plating commences and during a plating process.

Also shown in FIG. 1B, on lip 133 of cup 101, are a plurality of wafer guides, 145. These guides are used to orient wafer 125 such that its outermost edge aligns accurately with lip seal 135. This will be described in more detail below with reference to subsequent figures. Note that cup 101 includes a circumferential side wall 147 which defines an interior region of the cup and a lip 133 for supporting wafer 125. The invention is not limited to cups of this shape or configuration. A "cup" of the invention can include a structure not having such a circumferential sidewall. For example, a particularly preferred cup of the invention has a ring structure with a flat top surface (including an inner circumferential edge or "lip", refer to FIGS. 1F–I). In this case, such a flat surface having similar wafer guides 145 may define a "cup" in the context of this invention.

Figure 1D:
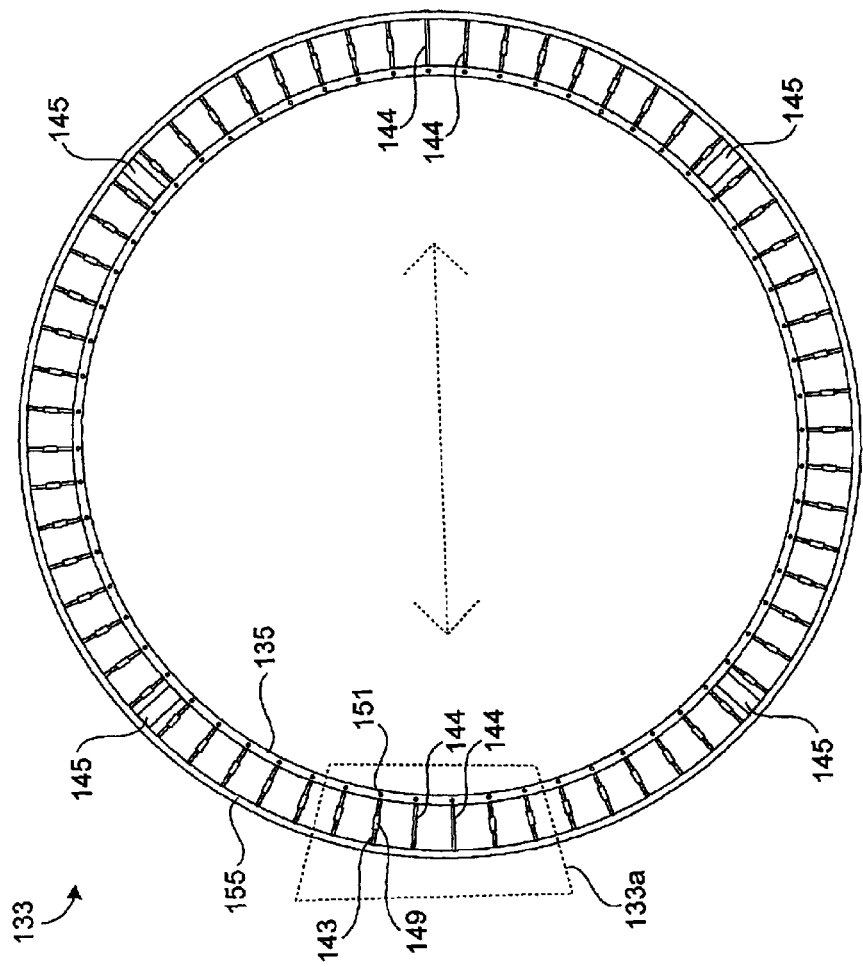
FIGS. 1C and 1D are top view diagrams showing an arrangement of electrical contacts in accordance with the invention.
Figure 1C:
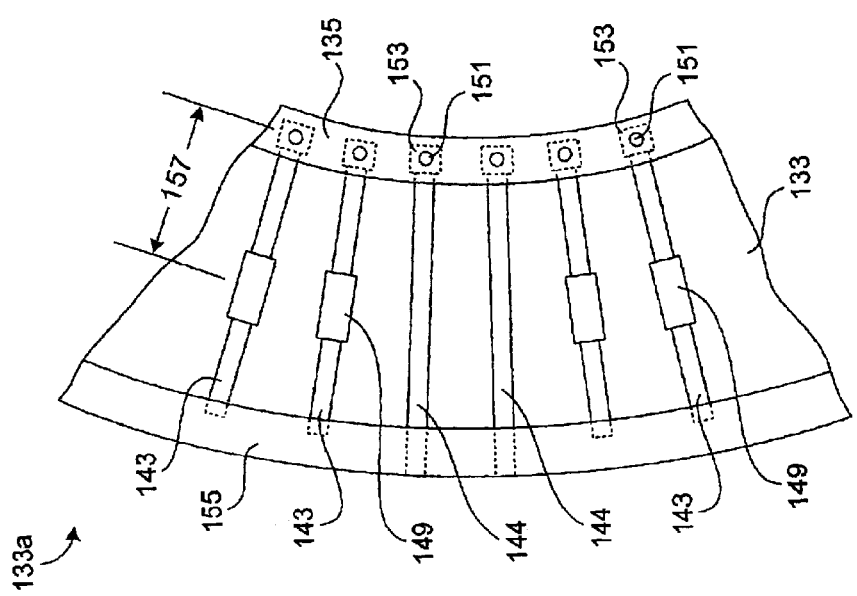

FIG. 1C is a cut out top view of a portion, 133a, of lip 133 of cup 101, showing more detail of the electrical contacts depicted in FIG. 1D (and FIG. 1B). As mentioned, the electrical contacts include two groups, those for delivering plating current to the wafer, 143, (as part of a first circuit) and those for measuring resistance of the seed or other metal layer on the wafer, 144, (as part of a second circuit). Electrical contacts 143, as depicted in this figure, have an in-line resistor 149 as part of their structure. Electrical contacts 143 make up a first group of contacts for delivering plating current to the wafer. Preferably, resistor 149 is a thick-film resistor made of a material including at least one of ruthenium oxide, platinum-silver, and palladium-silver. Thick-film resistors are preferable because they can be manufactured in parallel, for example using a screen printing technology, on a substrate (such as a ceramic cup 101) as part of the group of electrical contacts 143. As mentioned, laser trimming of the thick-film resistors is used after deposition, curing, and sealing. This provides accurate matching of conduction pathways. This compensates for variations in trace length and normal manufacturing tolerances of thick-film resistors. Alternatively, printed circuit board technology can be used to construct the electrical connection/resistor network.

Again referring to FIGS. 1C–D, lip seal 135 is a continuous structure with embedded contacts 151. In this example, contacts 151 are thin wires that can deform with lip seal 135 when compressed by the wafer. Contacts 151 rest on a contact pad 153 which is part of electrical connections 143 and 144. The distance, 157, from resistor 149 to contact 151 is important, and it depends on the resistance regime of resistor 149. It is desirable to have a large resistance close to embedded contacts 151 (of electrical contacts 143 used to deliver plating current) to minimize the effect of contact resistance variation. Preferably resistor 149 has an electrical resistance of between about 1 and 20 ohms. In a specific embodiment, the electrical resistance of the resistor is about 6 ohms. Preferably the resistor is between about 2 and 50 mm from the point where its associated contact 151 meets the metal layer, more preferably about 5 mm.

In this example, electrical contacts 143 electrically communicate with a shunt bar 155. Shunt bar 155 is used when plating current is supplied to all of electrical contacts 143 via a single current source (not shown). As mentioned, in a particularly preferred embodiment, each of electrical contacts, 143, has its own individually regulated current source (not shown).

Electrical contacts 144, for checking continuity of the seed layer via resistance measurements, are not electrically connected to shunt bar 155. Electrical contacts 144 do not have associated in-line resistors. Electrical contacts 144 are part of a circuit that is separate from the circuit or circuits used to deliver plating current to the electrical contacts 143, as will be discussed in more detail in association with subsequent figures. In one embodiment, preferably there are between about 2 and 16 electrical contacts 144.

One skilled in the art would understand that current sources and other circuitry that electrically communicate with electrical contacts 143 and 144 can be contained within (integral to) the cup and cone assembly in any number of configurations. That is, components of the circuits are contained both in the cup and the cone (or other wafer holding assembly configured for electroplating). In one example, when the cup and cone are engaged, electrical communication between components of the circuits is made. In another example, although components of the described circuits are contained both in the cup and the cone, the electrical communication between the components is fixed, that is, it does not depend on engagement of the cup with the cone. A more detailed description of the circuitry for delivering and controlling both the plating current and measuring the resistance of seed (or other) layers will be discussed in more detail in association with subsequent figures.

FIG. 1D shows a top view of lip 133 of cup 101 according to one embodiment of the invention. Included within dotted line 133a is the portion of lip 133 shown in detail in FIG. 1C. There is a plurality of contacts 151 embedded in lip seal 135. As mentioned, a plurality of electrical contacts 143 (each with an in-line resistor 149) for delivering plating current to the wafer are arranged radially about lip 133. Each electrical contact 143 has a corresponding embedded contact 151 (contact pads 153 not shown in FIG. 1D). In this figure, there are sixty such contacts depicted, but preferably there are between about 100 and 1000 electrical contacts for delivering plating current to the wafer. In a particularly preferred embodiment there are 128 such electrical contacts for a 200 nm wafer and 384 electrical contacts for a 300 mm wafer. Each of electrical contacts 143 and 144 may also have multiple embedded contacts 151. This serves to average the total electrical contact resistance, which equalize the effectiveness of trimmed resistors 149.

Also on lip 133 are four electrical contacts 144, for measuring resistance of the wafer seed layer. Electrical contacts 144 are used to measure resistance of the seed layer across the wafer surface (via their associated embedded contacts 151), as depicted by the dotted arrows. This allows for accurate four-point measurement of the seed resistance, for example allowing a continuity check of the seed layer before committing to a plating process. In this way, costly unnecessary plating can be avoided. Since there are four electrical contacts 144, two opposing electrical contacts are used to pass a test current through the seed layer, while the other two opposing electrical contacts 144 are connected to a voltmeter in order to measure the resistance of the seed layer to flow of current. In one embodiment, this is done just prior to immersion into a plating solution. In another embodiment, preferably the resistance is measured during a plating sequence. A more detailed description of methods of the invention are included below with reference to subsequent figures.

The invention is not limited to four-point measurement systems. More or fewer electrical contacts 144 may be employed in alternative embodiments (e.g. multiple sets of electrical contact pairs 144, e.g. four sets of two contacts). An advantage of a four-point measurement is that the resistance of the wiring in opposing electrical contacts 144 cancel out, giving a precise/accurate measurement of the copper seed film. This is achieved by flowing a current through the conductive layer (e.g. a copper layer), and measuring the resulting voltage drop. It is best if the embedded contacts 151 for the voltage/current are close to one another.

Figure 1E:
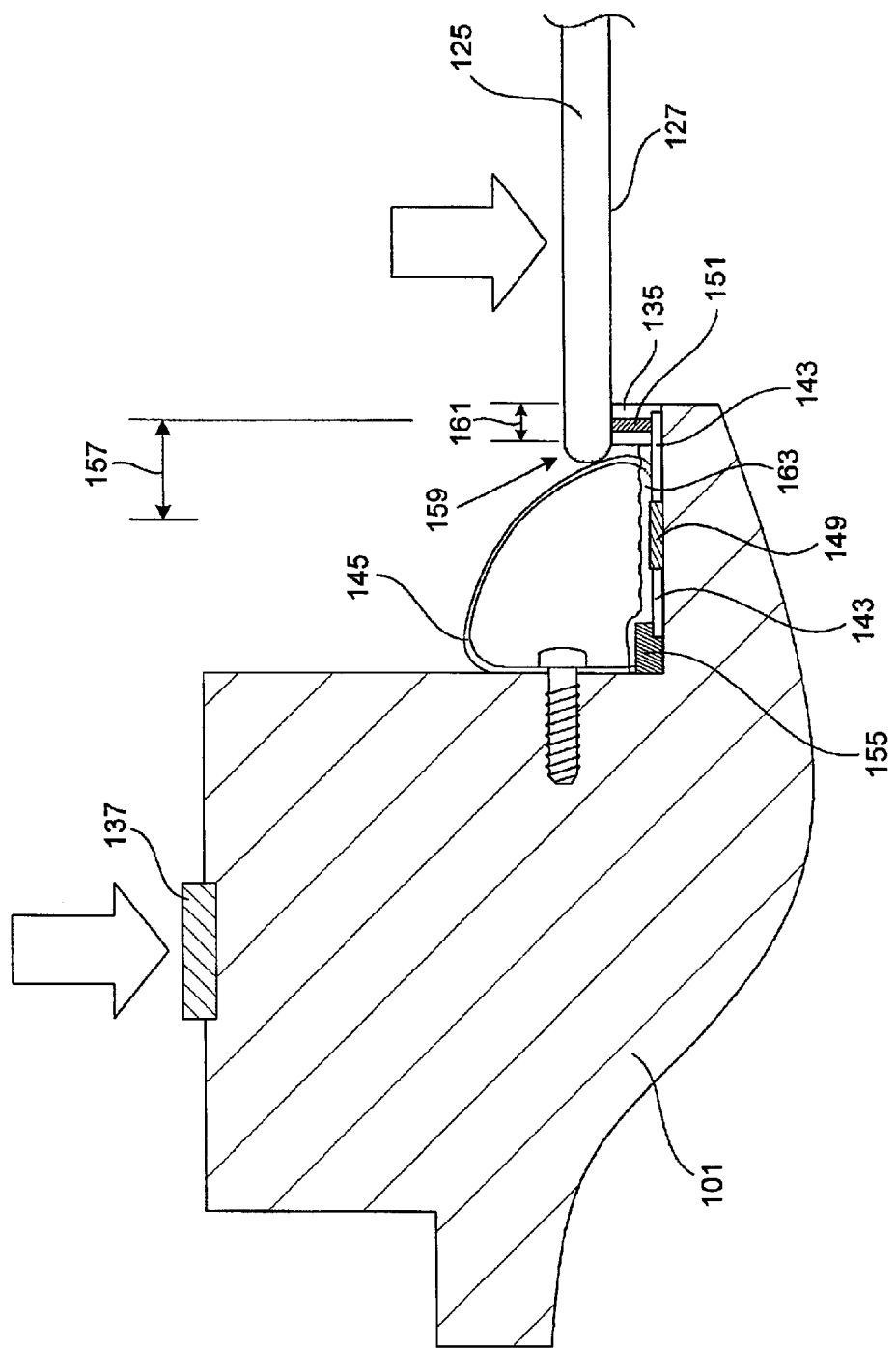
FIG. 1E is a cross sectional diagram depicting more detailed aspects of a cup in accordance with the invention.

FIG. 1E is a cross sectional diagram depicting more detailed aspects of cup 101. As mentioned, preferably at least a portion of the cup is made from a material including at least one of a plastic, a ceramic, a plastic-coated ceramic, a glass-coated ceramic, a plastic-coated metal, a glass, a glass-coated metal, and a composite. A preferred plastic used in the coating of the plastic-coated ceramic or metal is a fluoropolymer. Preferred materials for a ceramic or a ceramic used in the plastic-coated ceramic are alumina or zirconia Lip seal 135 is preferably made of an electrolyte resistant elastomer with poor bath wetting characteristics. Examples of suitable elastomers include Chemraz (Green, Tweed, and Co.), Sifel (Shin-Etsu Polymer Co.,Ltd.), Viton (Dupont),Tefzel (Dupont), Kalrez (Dupont), and various silicone rubbers. Generally, fluoropolymers work well for this seal material. In a particularly preferred embodiment, cup 101 is made of a ceramic, and contacts, 151, embedded in lip seal 135, are made of a corrosion resistant material including at least one of berylium-copper, gold-palladium, berylium-copper plated with gold-palladium, Paliney-7, platinum plated on stainless steel, rhodium plated on stainless steel, and rhodium. Preferably contacts 151 are wires between about 0.003 and 0.015 inches in diameter. There are commercially available elastomers with embedded conductors suitable for the lip seal of the invention. Such comnmercially available elastomers with embedded conductors preferably include ShinEstu connectors (Shin-Etsu Polymer Co.,Ltd.).

Again, referring to FIG. 1E, a plurality of contacts 151 are embedded in an elastomeric lip seal 135, and thus are protected from exposure to corrosive plating fluids. Contacts 151 make physical contact with the seed layer (not shown) on the front side, 127, of wafer 125 and thus complete electrical communication through electrical contacts 143 and 144. As mentioned, resistor 149 (art of each of electrical connections 143) preferably is made using thick-film technology e.g. it is laid down via a screen printing method that includes the manufacture of 143. Preferably this is done on a ceramic cup 101 or at least a ceramic lip 133 of cup 101. As mentioned, the distance, 157, from contact 151 to resistor 149 is preferably a small distance. In this example, electrical contact 143 communicates electrically with shunt bar 155.

As indicated by the broad arrows, when engaged with cup 101, the cone (not shown) applies a downward force on wafer 125 and pushes it against lip seal 135. The cone also presses directly against seal 137. Once these two seals are compressed by the cone, the back side of wafer 125 is protected from plating solution Also protected are electrical contacts 143, 144, and their associated embedded contacts 151. Additional protection is provided to electrical contacts 143, and 144 by glass coating 163.

Wafer guides 145 are shaped and positioned in such a way as to guide the wafer accurately to a resting point on lip seal 135 as depicted in FIG. 1E. As the wafer is lowered into cup 101, the outer edge slides along guides 145 until the wafer is aligned on lip seal 135. Only bevel 159 need touch the wafer guides. Once in place, lip seal 135 touches the outer most edge of the seed layer (not shown) on the wafer. Upon compression against wafer 125, lip seal 135 will deform only slightly. Preferably, when the cone is engaged with the wafer and cup 101, the width, 161, of lip seal 135 will be between about 1 and 4 mm, more preferably about 1 mm. By moving the lip seal out to the edge of the wafer, and by using a thin lip seal, the usable area of the plated wafer is increased. Only bevel 159 of wafer 125 ties over the edge of lip seal 135 closest to wafer guide 145, when the cup and cone are engaged.

There is a correlation between the area near the lip seal and defect formation in plated metal on wafers. This correlation is due in part to electrolyte flow patterns as well as localized electrical current non-uniformities. Even if the theoretical number of die that can be harvested from a given area of a plated wafer is not increased, the number of usable die that are harvested from that area is increased by virtue of moving the lip seal (and thus any associated surface defects) further out on the edge of the wafer.

Figure 1F:
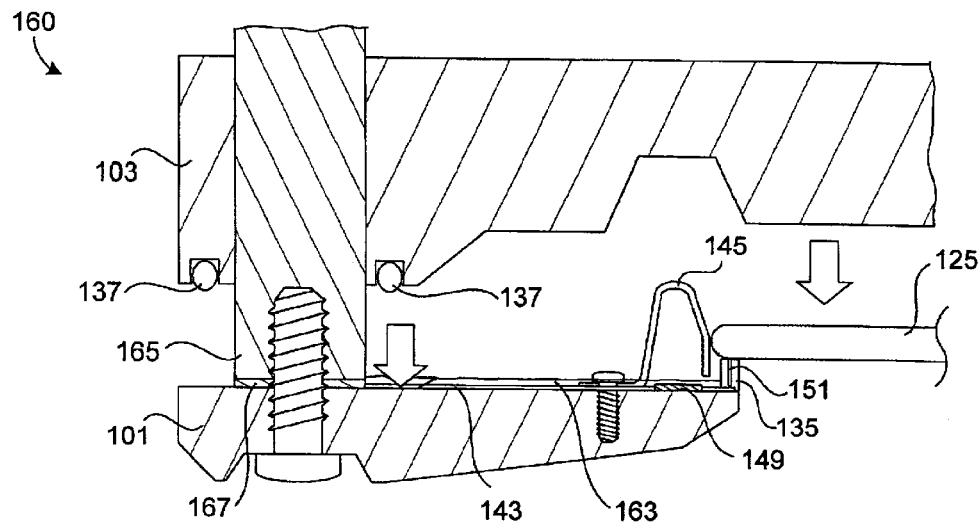
FIGS. 1F–G are cross sectional diagrams depicting more detailed aspects of another cup/cone assembly in accordance with the invention.
Figure 1G:
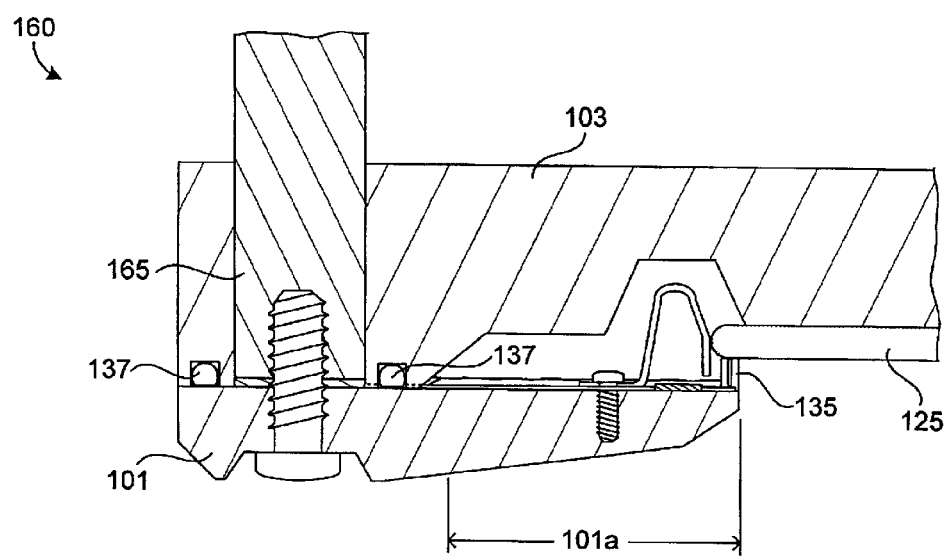

As mentioned, cups of the cup/cone assembly of apparatus of the invention can have a flat top surface (that surface which engages with the cone to make a fluid-tight seal). FIG. 1F is a cross sectional diagram depicting more detailed aspects of a portion of a cup/cone assembly, 160, with contacts embedded in a lip seal of the cup in accordance with the invention. For consistency, many of the reference numbers from FIGS. 1C–E are used whenever appropriate in FIG. 1F. In this case, the cup 101 has a flat top surface. Cone 103 is driven by, for example, an air cylinder (not shown). In this case, cone 103 slides along shaft 165 (as indicated by the broad arrows). Cup 101 is affixed to shaft 165. In this example, electrical connection to electrical contacts 143 and 144 of the invention are made via a pad 167. More specifically, shaft 165 contains wiring that makes electrical connection with pad 167 when the shaft and cup 101 are mated (in this case a bolt is depicted affixing the shaft with the cup). As depicted in FIGS. 1F–G, after wafer 125 is inserted into cup 101, cone 103 moves downward and engages cup 101. Seals 137 compress between the cup and the cone and form fluid-tight seals. Lip seal 135 compresses against the front side (work surface) of wafer 125, also making a fluid-tight seal. Embedded contacts in the lip seal make electrical connection to a metal layer on the wafer work surface, preferably a seed layer.

Referring again to FIG. 1F, wafer guide 145, lip seal 135, thick-film resistor 149, electrical contact 143, and glass coating 163 are positioned on the outer lip of cup 101 and perform functions as described above in relation to FIGS. 1A–E. In this particularly preferred embodiment, electrical contacts 143 are connected to a pad, 167, rather than a shunt bar. Pad 167 is a centralized contact area for a subset of the plurality of electrical contacts 143. There are at least two pads 167, but there can be more, depending (for example) on how resistors 149 and electrical contacts 143 are patterned on the top surface of cup 101.

Thus is this preferred embodiment, electrical connection is maintained from embedded contact 151, through electrical contacts 143, pad 167, and shaft 165. In this example, shaft 165 is electrically connected (e.g. via wiring within shaft 165) to a current source which feed electrical contacts 143. Electrical current can be passed to the seed layer of the wafer when the wafer is resting on the lip seal (via contacts 151) whether or not the cone is engaged with the cup.

Figure 1I:
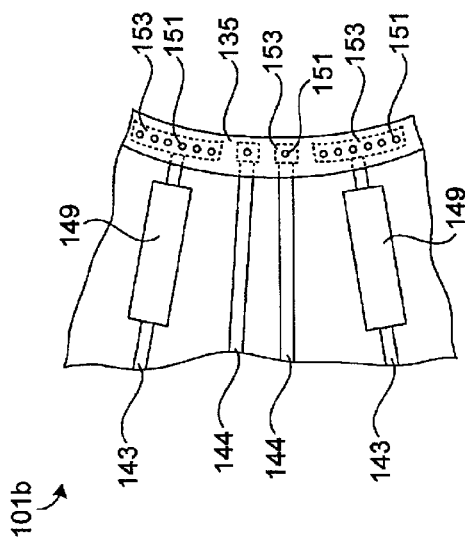
FIGS. 1H–I are top view diagrams showing an arrangement of electrical contacts and contacts in accordance with the invention.
Figure 1H:
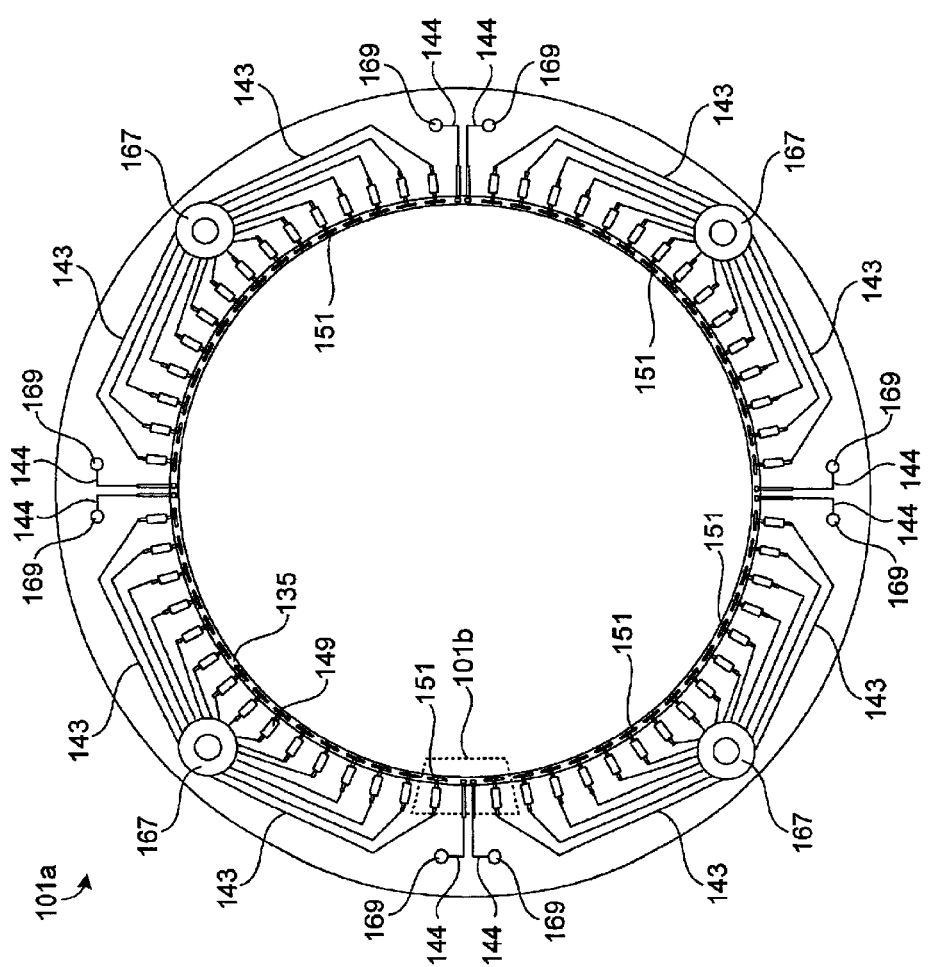

FIG. 1H depicts a top view, 101a, of cup 101 (as depicted in FIG. 1G). Lip seal 135 contains contacts that communicates electrically with contacts 143 and 144. Electrical contacts, 143, are divided into four subsets, each subset making electrical connection with pad 167 (holes in pads 167 are for the bolt as depicted in FIG. 1G for connection to shaft 165). Electrical contacts 144 each have a pad 169. When cone 103 is engaged with cup 101, distinct electrical contacts (not depicted) in the cone make electrical connection each with a corresponding pad 169. In this example, each of electrical contacts 143 has a corresponding plurality of embedded contacts, 151 (and corresponding contact pad 153). In this example, there are sixty electrical contacts 143, each having a thick-film resistor and each configured to make electrical contact with the wafer seed layer via six embedded contacts 151.

FIG. 1I depicts an area 101b of top view 101a of the cup. Electrical contacts 144 have contact pads 153, each having a single embedded contact, 151 (for example, a wire embedded in lip seal 135), for making contact with the wafer. Electrical contacts 143 have a plurality of embedded contacts, 151. In this way, more efficient current flow and detection methods are realized.

Figure 2A:
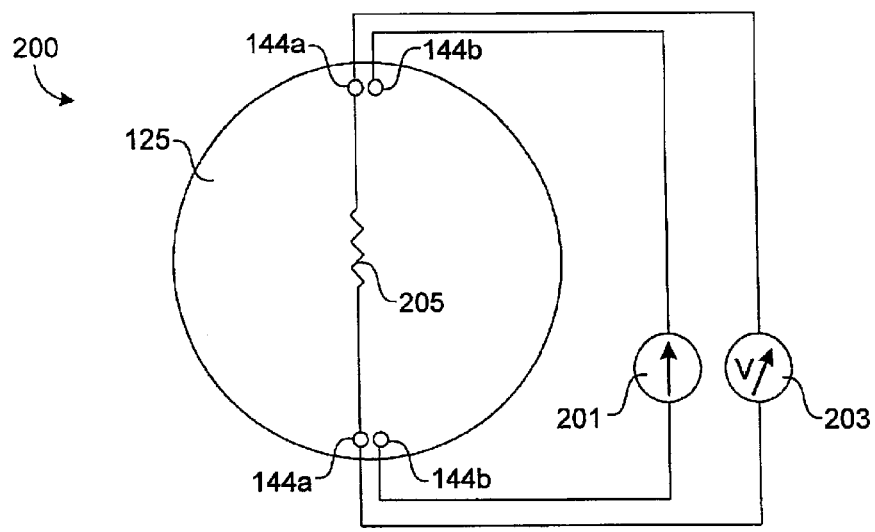
FIG. 2A is a simplified circuit diagram showing a preferred configuration for measuring the resistance of a seed layer in accordance with the invention.

FIG. 2A is a simplified circuit diagram depicting a continuity check circuit, 200, for assessing the continuity of a seed layer on a wafer. As mentioned, there are four electrical contacts 144 that touch (via their associated contacts 151) a seed layer (not depicted) on wafer 125. In this case, electrical contacts 144 are divided into two pairs of opposing electrical contacts, 144a and 144b. Electrical contacts 144a are wired to a voltmeter 203. Electrical contacts 144b are wired to a current source 201, and thus provide a current that flows through the seed layer on wafer 125. Once a current flow is established, voltmeter 203 (via contacts 144a) is used to measure the resistance 205 of the metal (seed) layer. By using a known standard seed layer resistance measurement, at the same current level, the continuity of the seed layer can be accurately determined. As mentioned, circuit 200 is separate from the plating circuit. Various calibration techniques known to those of skilled in the art may be employed with this invention.

Figure 2B:
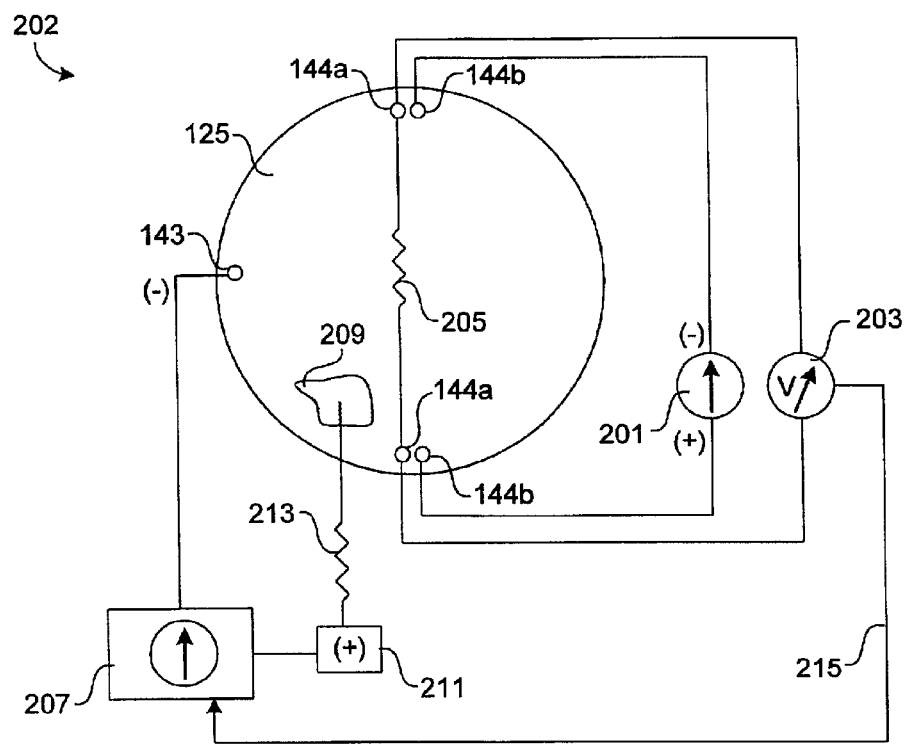
FIG. 2B is a simplified circuit diagram showing a preferred configuration for providing plating current to a plurality of contacts in accordance with the invention.

FIG. 2B is a simplified circuit diagram depicting a circuit 202 in accordance with the invention. Included in circuit 202 is continuity check circuit 200 as described in reference to FIG. 2A, and a plating circuit. The continuity check circuit component of circuit 202 is used not only to assess seed layer continuity but also resistance of the plated metal layer thereon during the electroplating process. Specific electroplating methods of the invention will be described in more detail below with reference to subsequent figures.

In the plating circuit component of circuit 202, current source 207 provides plating current to a conductive seed layer 209 (depicted in part) through electrical contacts 143 (via associated contacts 151 at the wafer's outer perimeter as described above). The wafer is the cathode. A metal anode 211 (for example copper) supplies metal ions to replenish plating electrolyte with metal ions depleted from the electrolyte during plating. The plating circuit is closed via current passing through seed metal layer 209 (and subsequent plated layer) and the plating electrolyte to anode 211. There is an associated resistance to current flow, 213, through the electrolyte during plating.

Current source 201 (with its associated electrical contacts) is used, as described above, as part of continuity check circuit 200 to assess the integrity of the seed layer. As mentioned this can be done during a plating process. Preferably this is done by stopping the plating current flow for short periods (on the order of milliseconds) in order to measure the resistance of the deposited metal layer via circuit 200 (for example). In a preferred embodiment of the invention, circuit 202 includes a feedback communication line, 215, for providing metal layer resistance information to plating current source 207. A proportional algorithm is used to adjust plating current as a function of metal film sheet resistance. Thus, film sheet resistance is measured in-situ, and this information is used to control the plating current, minimizing non-uniformity due to resistance drop across the wafer. One skilled in the art would recognize that such a feedback control element of circuit 202 could be implemented by a suitably-equipped computer or similar controller. Parasitic resistance due to the plating bath would need to be characterized and compensated for.

Figure 2C:
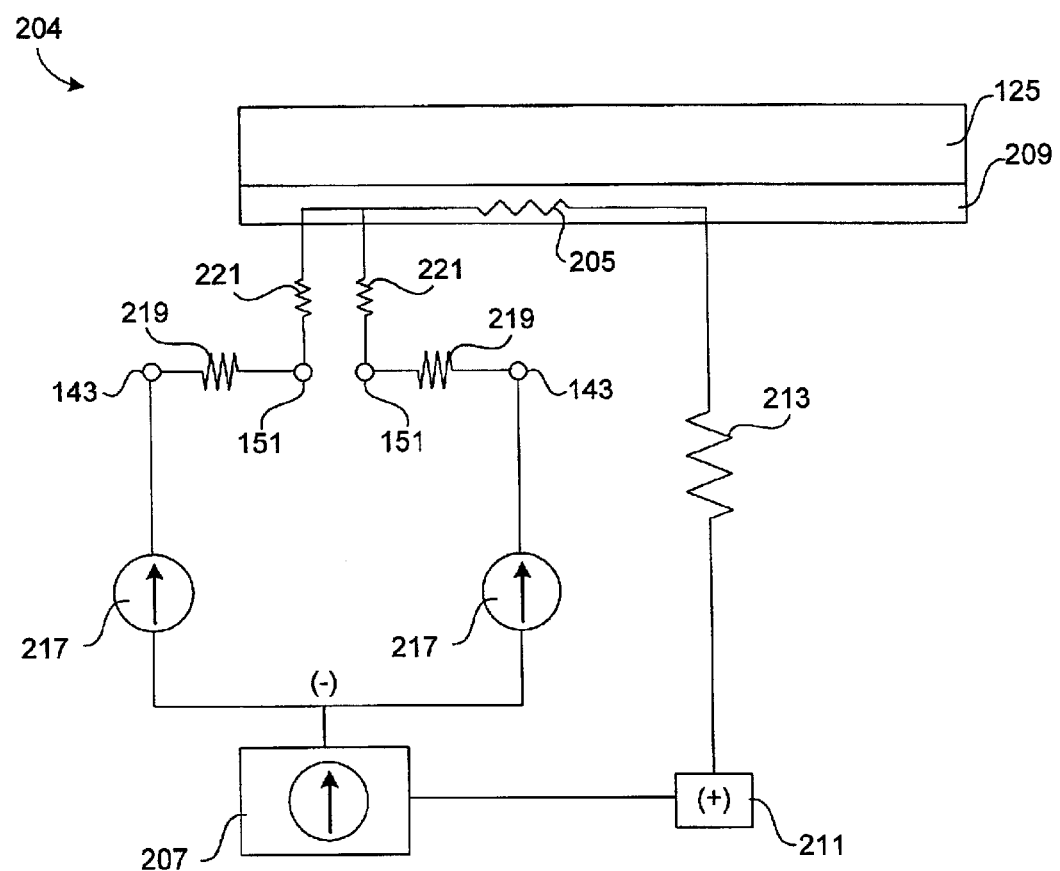
FIG. 2C is another simplified circuit diagram showing a preferred configuration for providing plating current to a plurality of contacts in accordance with the invention.

In circuit 202 of FIG. 2B, a single current source, 207, provides plating current to wafer 125 via a plurality of electrical contacts 143 (refer to FIG. 1D). As mentioned, in a particularly preferred embodiment, each electrical contact 143 is fed through an individually tunable current source. FIG. 2C is a simplified circuit diagram, 204, in accordance with this embodiment of the invention. During plating, wafer 125 has a plated metal layer 210. As in FIG. 2B, a current source 207 supplies current to the wafer, but in this case, the current supplied is divided among individual (preferably tunable) current sources 217. Each of the individual current sources 217 provides current to electrical contacts 143. Preferably, as an alternative to current dividers, each electrical contact may have its own individually regulated current source (not depicted). Resistance 219 represents the resistance of the "swamping" resistors 149 (refer to FIG. 1C) located in close proximity to contacts 151. Resistance 221 represents the resistance between the embedded contacts 151 and the seed layer. Resistance 205 in this case is the sheet resistance of the plated metal layer 210. The plating electrolyte has an associated resistance to current flow, 213, between the metal layer (cathode) and anode 211. In this invention, preferably resistance 219 >> resistance 221, for the reasons specified above. This differential resistance is achieved in part by having multiple contacts 151 associated with the swamping resistors 149 (as depicted in FIG. 1I). A description of preferred methods implemented with the above described apparatus is provided below.

Figure 3A:
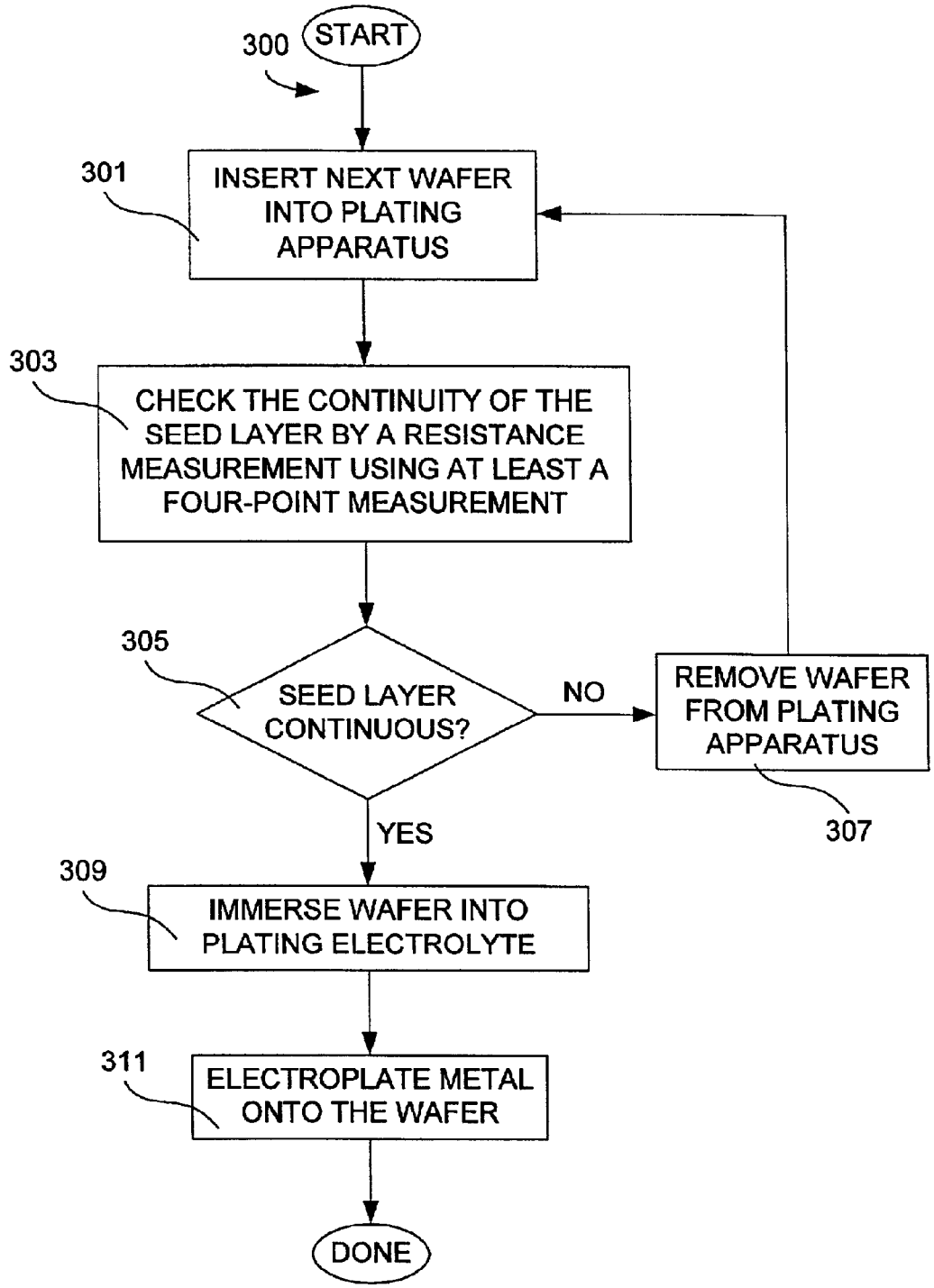
FIG. 3A is a flow chart depicting aspects of a method for electroplating in accordance with the invention.

FIG. 3A is a flow chart depicting aspects of a method, 300, for electroplating in accordance with the invention. A wafer is inserted into the plating apparatus. See 301. Next, the seed layer continuity is assessed using at least a four-point measurement, as described above using a two-circuit system. See 303. If the continuity test shows that the seed layer is defective or otherwise doesn't meet a standard, then the wafer is removed from the electroplating apparatus. See 305–307. Once the wafer with the unsatisfactory seed layer has been discarded, another wafer is loaded into the apparatus for a corresponding continuity check before plating. See 301–303. Referring back to decision block 305, if the continuity check is satisfactory, then the wafer is immersed into the plating electrolyte and metal is electroplated onto the wafer. See 309–311. After the wafer is electroplated, then method 300 is done.

Figure 3B:
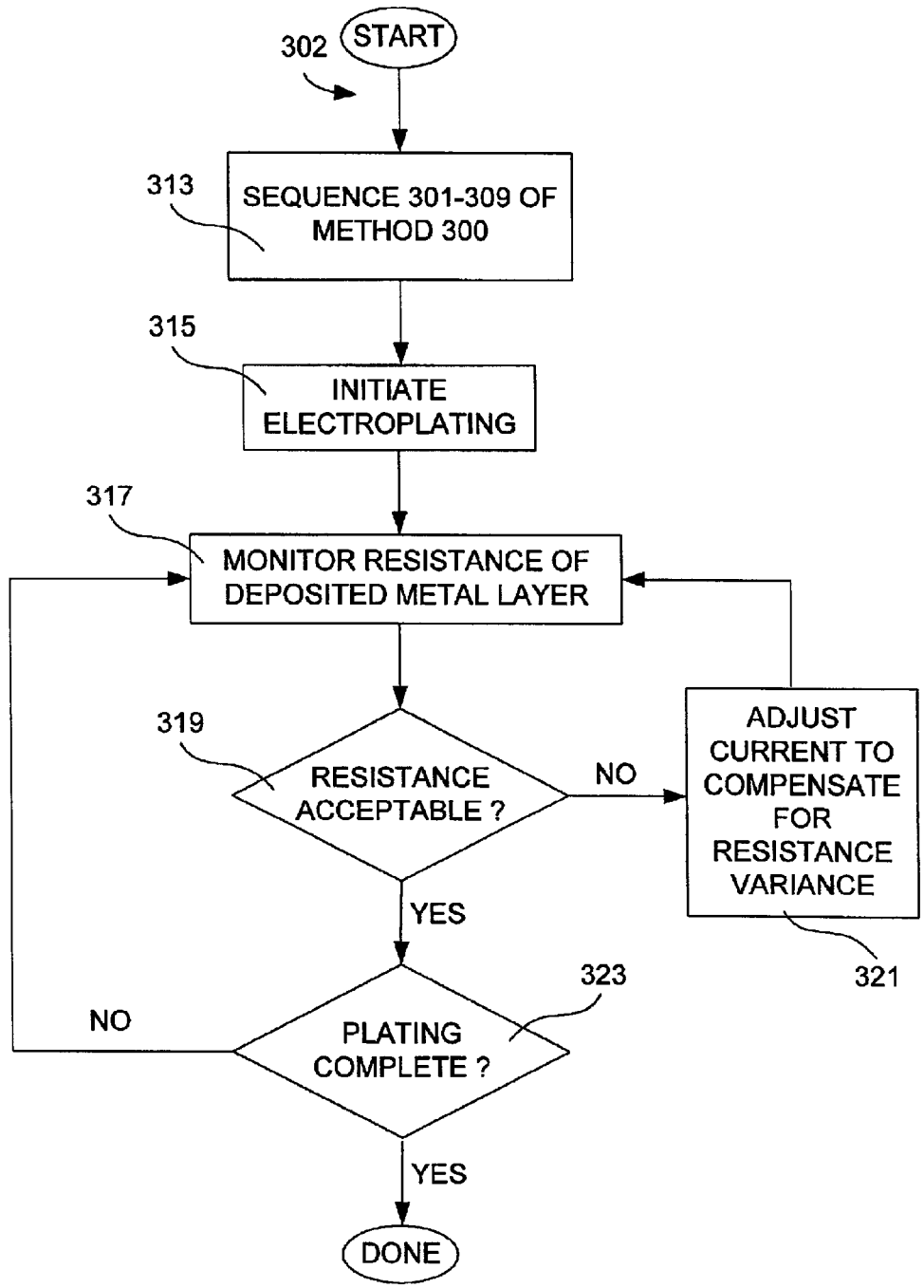
FIG. 3B is a flow chart depicting aspects of another method for electroplating in accordance with the invention.

As mentioned, in a particularly preferred method of the invention, the seed layer continuity check circuit (as described above) is used to further measure the resistance of the electroplated metal layer during the electroplating process. This resistance data is used in a feedback control mechanism to tune the plating current and thus control uniformity of the plated metal layer. FIG. 3B depicts a electroplating method, 302, for controlling uniformity of plated metal during plating, using resistance data feed back control. Method 302 begins with the same process as described for method 300 of FIG. 3B. See 313. That is, the continuity of the seed layer on the wafer is assessed using a four-point measure, and when an acceptable seed layer is found, the wafer is immersed into the plating electrolyte. Next, electroplating is initiated. See 315. After plating is initiated, the resistance of the deposited metal layer is measured using the continuity check circuit as described above. See 317.

In this method, the resistance is monitored during the entire plating process. As mentioned, this is done by stopping the flow of plating current for a few milliseconds in order to measure the resistance. Depending on the resistance measurement value, the plating current is adjusted not only to compensate for resistance irregularities, but also to adjust overall rate of plating depending on the desired plating outcome. One example would be a slower plating rate when plating starts (to fill deep features) and a faster plating rate for bulk fill. If the resistance across the wafer is unacceptable, then the current is adjusted to compensate for, for example, a variance from a standard. During electroplating, as the metal layer builds up on the wafer, the resistance levels will correspondingly drop. Thus, standard resistance curves are created for a desired plating uniformity/resistance level profile. Proportional algorithms are used to adjust plating current based on the standard resistance curves for an ideal plating run (the standard). Throughput gains are realized as well. As mentioned, plating current can be increased to a maximum level for bulk plating as soon as electrofill (e.g. having more stringent "bottom-up" requirements) is complete.

Methods of the invention can be implemented using apparatus of the invention having single-source plating current contacts, but it is particularly useful with apparatus of the invention having individually tunable current sources for each plating current contact. In this way, the mean current profile over all electrical contacts can be varied over time. This allows detection of a point where sufficient deposition had occurred for application of maximum current without negative impact on fill properties. This may be especially useful where wafer to wafer seed layer resistance varies significantly due to device density and layer topology. As well, electrical contacts of the invention can be used for liquid detection. For example, plating solution leakage into the electrical contact area or onto the wafer backside creates process and hardware reliability issues, as well as contaminating the wafer with copper ions. Leakage can allow metal (e.g. copper) to be deposited onto the contacts, which creates azimuthal uniformity problems. Deposition of copper onto the contacts may also prevent proper sealing of subsequent wafers. It is desirable to detect leakage of plating solution in the contact region before copper is deposited, however it can be performed at any time during plating. In a preferred embodiment, electrical contacts and circuits as described above are used to detect the presence of plating solution or other electrically conductive fluid (e.g. via short circuit detection) in the electrical contact area of the cup. Such leak detection indicates failure of one or more seals in the clamshell apparatus.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An apparatus for engaging a work piece during an electrolytic process, the apparatus comprising:
   a cup having an interior region and a lip within the interior region arranged such that the lip can support the work piece while the work piece remains within the interior region;
   a first plurality of electrical contacts arranged about the lip for providing electrical current to the work piece via a metal layer thereon;
   a second plurality of electrical contacts, which do not include electrical contacts from the first plurality of electrical contacts, arranged about the lip for measuring electrical resistance through the metal layer on the work piece; and
   a cone having a work piece contact surface that fits within the cup's interior and can contact the work piece in a manner that holds the work piece in a fixed position between the work piece contact surface and the lip;
   wherein a first circuit contains the first plurality of electrical contacts and a second circuit, isolated from the first circuit, contains the second plurality of electrical contacts.

2. The apparatus of claim 1, wherein each contact of the first plurality of electrical contacts comprises a resistor.

3. The apparatus of claim 2, wherein the resistor is a thick-film resistor.

4. The apparatus of claim 3, wherein the thick-film resistor is made of a material comprising at least one of ruthenium oxide, platinum-silver, and palladium-silver.

5. The apparatus of claim 2, wherein the resistor has an electrical resistance of between about 1 and 20 ohms.

6. The apparatus of claim 5, wherein the resistor is between about 2 and 50 mm from the point where its associated electrical contact meets the metal layer.

7. The apparatus of claim 6, wherein the resistor is about 5 mm from the point where its associated electrical contact meets the metal layer.

8. The apparatus of claim 2, wherein the resistor has an electrical resistance of about 6 ohm.

9. The apparatus of claim 1, wherein the work piece is a semiconductor wafer.

10. The apparatus of claim 9, wherein the lip comprises a lip seal made from a material that provides a fluid-tight seal with the semiconductor wafer when the wafer is held in place by the cone.

11. The apparatus of claim 10, wherein the material is an elastomer comprising at least one of a silicone rubber, a fluoropolymer, a butyl rubber.

12. The apparatus of claim 11, wherein each of the first and second plurality of electrical contacts makes electrical connection to the metal layer via one or more embedded contacts in the elastomer.

13. The apparatus of claim 12, wherein the one or more embedded contacts comprise at least one of conductive polymers, wires, flat metal springs, connectors, and z-conductive polymers.

14. The apparatus of claim 13, wherein the one or more embedded contacts comprise at least one of berylium-copper, gold-palladium, berylium-copper plated with gold-palladium, Paliney-7, platinum plated on stainless steel, rhodium plated on stainless steel, and rhodium.

15. The apparatus of claim 14, wherein the embedded contact comprises a wire.

16. The apparatus of claim 15, wherein the wire is between about 0.003 and 0.015 inches in diameter.

17. The apparatus of claim 12, wherein the width of the lip seal is between about 1 and 4 mm wide.

18. The apparatus of claim 17, wherein the width of the lip seal is about 1 mm wide.

19. The apparatus of claim 18, wherein lip seal contacts the metal layer on the wafer's outermost circumferential edge.

20. The apparatus of claim 9, wherein the metal layer is a copper seed layer.

21. The apparatus of claim 1, wherein at least a portion of the cup comprises at least one of a plastic, a ceramic, a plastic-coated ceramic, a plastic-coated metal, a glass, a glass-coated metal, a glass-coated ceramic, a silicon-oxide coated ceramic, and a composite.

22. The apparatus of claim 21, wherein a plastic used in the coating of the plastic-coated ceramic or metal is a fluoropolymer.

23. The apparatus of claim 21, wherein the ceramic or a ceramic used in the plastic-coated ceramic is alumina or zirconia.

24. The apparatus of claim 1, wherein the first plurality of electrical contacts comprises between about 100 and 1000 electrical contacts.

25. The apparatus of claim 24, wherein the first plurality of electrical contacts comprises at least 128 electrical contacts for a 200 mm wafer.

26. The apparatus of claim 24, wherein the first plurality of electrical contacts comprises at least 384 electrical contacts for a 300 mm wafer.

27. The apparatus of claim 1, wherein the second plurality of electrical contacts comprises between about 2 and 16 electrical contacts.

28. The apparatus of claim 1, wherein the second plurality of electrical contacts comprises 4 electrical contacts.

29. The apparatus of claim 1, wherein each contact of the first plurality of electrical contacts has its own individually regulated current source.

* * * * *